United States Patent
Wu et al.

(10) Patent No.: US 10,712,665 B2
(45) Date of Patent: Jul. 14, 2020

(54) METHOD FOR MANUFACTURING ARRAY SUBSTRATE AND METHOD FOR MANUFACTURING LIQUID CRYSTAL ANTENNA

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Xiaojuan Wu, Beijing (CN); Yao Bi, Beijing (CN); Hongliang Yuan, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/621,120

(22) PCT Filed: Apr. 10, 2019

(86) PCT No.: PCT/CN2019/082070
§ 371 (c)(1),
(2) Date: Dec. 10, 2019

(87) PCT Pub. No.: WO2019/214387
PCT Pub. Date: Nov. 14, 2019

(65) Prior Publication Data
US 2020/0124969 A1    Apr. 23, 2020

(30) Foreign Application Priority Data

May 9, 2018 (CN) .......................... 2018 1 0438992

(51) Int. Cl.
*G03F 7/20* (2006.01)
*H01Q 21/00* (2006.01)

(52) U.S. Cl.
CPC ....... *G03F 7/2051* (2013.01); *H01Q 21/0087* (2013.01)

(58) Field of Classification Search
CPC ... G03F 7/2051; H01Q 21/0087; H01L 24/03; H01L 21/30
(Continued)

(56) References Cited

U.S. PATENT DOCUMENTS 4,846,556 A * 7/1989 Haneda ............. G02F 1/133512
359/891
2017/0125365 A1 * 5/2017 Cheng ..................... H01L 24/03

FOREIGN PATENT DOCUMENTS

CN         1825184 A  *  8/2006
CN       107978841 A  *  5/2018

* cited by examiner

*Primary Examiner* — Hung Nguyen
(74) *Attorney, Agent, or Firm* — Nath, Goldberg & Meyer; Joshua B. Goldberg

(57) ABSTRACT

The present disclosure provides a method for manufacturing an array substrate and a method for manufacturing a liquid crystal antenna, and relates to the technical field of liquid crystal antennas and array substrates. The method for manufacturing an array substrate includes: sequentially depositing a metal material layer and a photoresist material layer on a substrate to form a plurality of metal patterns and a plurality of photoresist patterns on the plurality of metal patterns; and forming a light-shielding material between at least two adjacent metal patterns such that the light-shielding material and the plurality of photoresist patterns have opposite hydrophobicity-hydrophilicity; curing the light-shielding material to form at least one light-shielding pattern such that a thickness of the at least one light-shielding pattern is the (Continued)

same as a thickness of the plurality of metal patterns; and
removing the plurality of photoresist patterns.

20 Claims, 4 Drawing Sheets

(58) Field of Classification Search
USPC .......................................................... 355/77
See application file for complete search history.

METHOD FOR MANUFACTURING ARRAY SUBSTRATE AND METHOD FOR MANUFACTURING LIQUID CRYSTAL ANTENNA

This is a National Phase Application filed under 35 U.S.C. 371 as a national stage of PCT/CN2019/082070, filed Apr. 10, 2019, an application claiming the benefit of Chinese Application No. 201810438992.4, filed May 9, 2018, the content of each of which is hereby incorporated by reference in its entirety.

TECHNICAL FIELD

The present disclosure relates to a technical field of liquid crystal antennas and array substrates, and in particular to a method for manufacturing an array substrate and a method for manufacturing a liquid crystal antenna.

BACKGROUND

With the rapid development of modern communication and the popularization of intelligent applications, the communication requirements are increasingly demanding, especially for mobile communications, aircrafts, vehicles, ships and the like. Accordingly, satellite antennas are required to meet the requirements of fast, accurate and intelligent communications. Mobile satellites communications are generally implemented by low-orbiting earth satellites. When the mobile satellite devices move, in order to continue to receive the information, the corresponding satellite antennas need to move a large angle to match the movement of the devices.

The smart panel antenna developed in recent years has wide application prospects in the field of mobile satellite communications, because it can be easily integrated into mobile devices such as automobile roofs, airplanes, ships and other vehicles, and it also has the advantages of no mechanical moving parts and low cost.

The liquid crystal antenna is a kind of smart panel antenna with excellent properties. It mainly controls the orientation of the liquid crystals and controls the phase difference by using the dielectric anisotropy of the liquid crystal, so that the antenna directionally receive signals of a certain frequency band and shield signals of other bands. The signal received by the liquid crystal antenna is generally in the microwave band, 12~30 GHz.

SUMMARY

The present disclosure provides a method for manufacturing an array substrate and a method for manufacturing a liquid crystal antenna.

The technical solution adopted for solving the technical problem of the present disclosure is a method for manufacturing an array substrate, wherein, sequentially depositing a metal material layer and a photoresist material layer on the substrate, and forming a plurality of metal patterns and a plurality of photoresist patterns over the plurality of metal patterns by a patterning process; forming a light-shielding material between at least two adjacent metal patterns; wherein the light-shielding material and the plurality of photoresist patterns have opposite hydrophobicity-hydrophilicity; curing the light-shielding material to form at least one light-shielding pattern such that a thickness of the at least one light-shielding pattern is the same as a thickness of a plurality of metal patterns, and removing the plurality of photoresist patterns.

In one embodiment, the curing the light-shielding material includes: curing the light-shielding material under light illumination.

In one embodiment, the photoresist material includes a material that is hydrophilic when not exposed to light and becomes hydrophobic after exposed to light.

In one embodiment, sequentially depositing a metal material layer and a photoresist material layer on the substrate, and forming a plurality of metal patterns and a plurality of photoresist patterns over the plurality of metal patterns by a patterning process includes: sequentially depositing the metal material layer and a positive photoresist material layer on the substrate; providing a mask over the photoresist material layer for exposure; removing an exposed part of the photoresist material layer, leaving an unexposed part of the photoresist material layer to form the plurality of photoresist patterns; and removing a part of the metal material under the exposed part of the photoresist material layer to form the plurality of metal patterns.

In one embodiment, the light-shielding material includes a carbon black material having a hydrophobic group connected to a molecular main chain.

In one embodiment, the hydrophobic group includes a hydrocarbon group or an ester group.

In one embodiment, the carbon black material between the plurality of metal patterns is cured by light illumination.

In one embodiment, sequentially depositing a metal material layer and a photoresist material layer on the substrate, and forming a plurality of metal patterns and a plurality of photoresist patterns over the plurality of metal patterns by a patterning process includes: sequentially depositing the metal material layer and a negative photoresist material layer on the substrate; providing a mask over the photoresist material layer for exposure; removing the unexposed part of the photoresist material layer, and leaving an exposed part of the photoresist material layer to form the plurality of photoresist patterns; and removing a part of the metal material under the unexposed part of the photoresist material layer to form the plurality of metal patterns.

In one embodiment, after removing the plurality of photoresist patterns, the method further includes: forming an alignment layer on the at least one light-shielding pattern and the plurality of metal patterns.

The present disclosure also provides a method for manufacturing a liquid crystal antenna, including manufacturing at least one substrate of an upper substrate and a lower substrate of the liquid crystal antenna by the method for manufacturing the array substrate.

In one embodiment, the at least one substrate comprises a lower substrate, and the plurality of metal patterns are microstrip lines.

In one embodiment, the at least one substrate comprises an upper substrate, and the plurality of metal patterns are ground electrodes.

In one embodiment, before sequentially depositing the metal material layer and the photoresist material layer on the substrate, the method further includes: depositing a metal material on a side of the substrate distal to the plurality of metal patterns, and forming a pattern of the antenna radiation patch layer by a patterning process; and forming a protective layer on a side of the substrate on which the antenna radiation patch layer is formed.

In one embodiment, further includes manufacturing the lower substrate by using the method for manufacturing the array substrate.

In one embodiment, further includes: aligning and assembling the upper substrate and the lower substrate to form a cell, filling liquid crystals in the cell; and sealing a periphery of the cell with sealant.

In one embodiment, the filling liquid crystals in the cell includes filling liquid crystals in the cell using a one drop filling or an irrigation crystal method.

In one embodiment, the aligning and assembling the upper substrate and the lower substrate to form a cell includes: aligning and assembling the upper substrate and the lower substrate with a side of the upper substrate with ground electrodes facing towards a side of the lower substrate with microstrip lines.

DETAILED DESCRIPTION

The embodiments of the present disclosure will be described in details below in conjunction with the accompanying drawings.

In the liquid crystal antenna, in order to make the liquid crystals have large dielectric anisotropy and small dielectric loss at a high frequency, it is generally required to use the liquid crystals having large birefringence, such liquid crystals generally contain liquid crystal monomers with poor light stability, that is, under the irradiation of UV and visible light, the properties of the liquid crystals change, thereby affecting the performance of the antenna. To solve this problem, it is possible to prevent the influence of UV and visible light on the properties of the liquid crystals during the manufacturing procedure and the use procedure by designing a light-shielding pattern (for example, a black matrix (BM)) between the upper and lower substrate metal patterns of the liquid crystal antenna.

In the existing manufacturing method, a BM Mask (black matrix mask) is generally required to form a BM pattern. When the BM is coated, since the metal pattern on the substrate has been formed and is thick, the thickness of the coated BM is uneven, and the thickness of the BM formed between the metal patterns is generally larger than the thickness of the metal pattern, so that the thickness of the alignment layer (polyimide, PI), which is subsequently coated, is uneven, resulting in disorder of orientation of the liquid crystals near the alignment layer, affecting the performance of the liquid crystal antenna.

Figure 1:
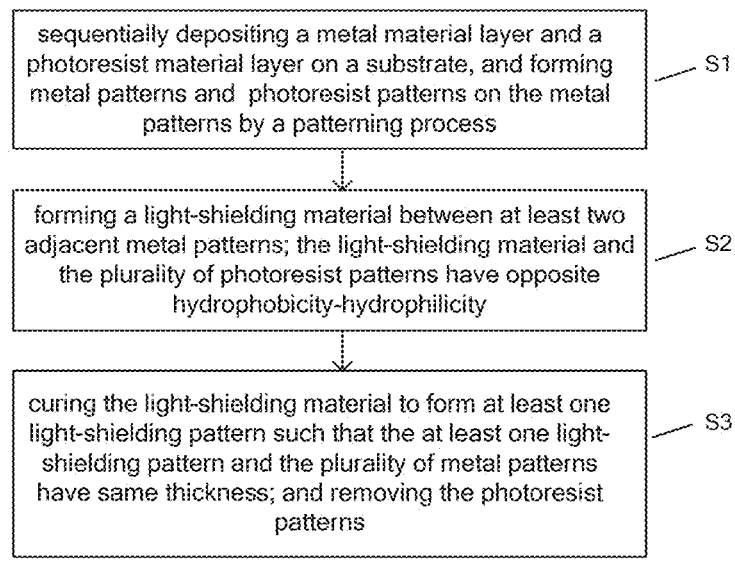
FIG. 1 is a flow chart of a method for manufacturing an array substrate according to some embodiments of the present disclosure.
Figure 2:
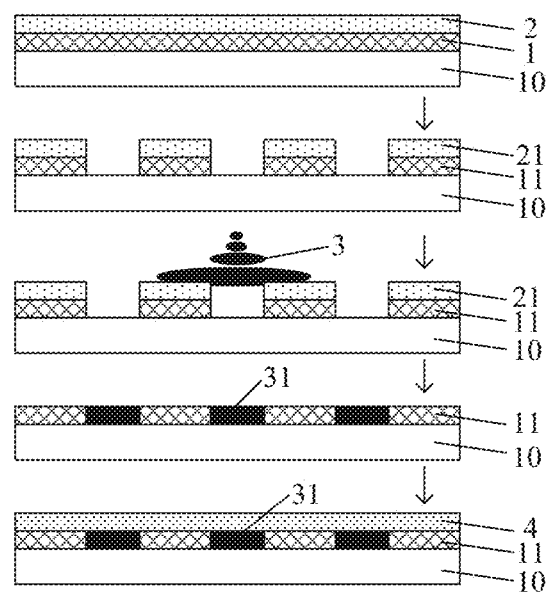
FIG. 2 is a process flow diagram of a method for manufacturing an array substrate according to some embodiments of the present disclosure.

FIG. 1 is a flow chart of a method for manufacturing an array substrate according to some embodiments of the present disclosure. FIG. 2 is a process flow diagram of a method for manufacturing an array substrate according to some embodiments of the present disclosure.

As shown in FIG. 1 and FIG. 2, the present embodiment provides a method for manufacturing an array substrate, which is particularly suitable for manufacturing a liquid crystal antenna substrate. In other embodiments of the disclosure, the manufacturing method may be used for manufacturing a color filter substrate, a display substrate or a COA (Color Filter on Array) substrate. In the following embodiments, the liquid crystal antenna substrate is taken as an example. The method for manufacturing the array substrate includes the following steps S1 to S3, as shown in FIG. 1:

Step S1: a metal material layer 1 and a photoresist material layer 2 are sequentially deposited on a substrate 10, and a plurality of metal patterns 11 and a plurality of photoresist patterns 21 are formed on the plurality of metal patterns 11 by a patterning process, as shown in FIG. 2. In one embodiment of the present disclosure, the thickness of the metal pattern 11 is generally around 2 um.

In this step, after the photoresist material layer 2 is formed on the metal material layer 1, a mask (not shown) is disposed over the photoresist material layer 2 for exposure, then the exposed portion of the photoresist material (e.g., using a developer) is removed, leaving a part of the photoresist material layer in the non-exposed area to form the plurality of photoresist patterns 21, further removing a part of the metal material layer 1 under the exposed portion of the photoresist material layer, thereby forming the desired metal patterns 11. The exposed portion of the photoresist material layer is removed by stripping in this step. In one embodiment of the present disclosure, the mask disposed over the photoresist material layer 2 may be a metal mask. In other embodiments of the disclosure, the mask may be a mask made of any other suitable material. In one embodiment of the present disclosure, the photoresist material layer 2 can be exposed by ultraviolet (UV) illumination. In other embodiments of the disclosure, the photoresist material layer 2 may be exposed by any other suitable means.

Step S2: a light-shielding material 3 is formed (for example, by drop filling) between at least two adjacent metal patterns 11, as shown in FIG. 2; the light-shielding material 3 and the photoresist pattern 21 are opposite in hydrophobicity-hydrophilicity. In one embodiment of the present disclosure, when the light-shielding material 3 is a hydrophobic (lipophilic) material, the photoresist pattern 21 is a hydrophilic (oleophobic) material; when the light-shielding material 3 is a hydrophilic (oleophobic) material, the photoresist pattern 21 is a hydrophobic (lipophilic) material. In one embodiment of the present disclosure, the photoresist may be a positive photoresist or may be a negative photoresist.

In the present embodiment, the light-shielding material 3 and the photoresist pattern 21 are opposite in hydrophobicity-hydrophilicity, so that when the light-shielding material 3 is dropped onto the substrate 10 on which the metal pattern 11 and the photoresist pattern 21 are formed, a repulsive force is generated between the photoresist pattern 21 and the light-shielding material 3, so that the light-shielding material 3 is completely dropped between adjacent metal patterns 11, and no light-shielding material remains above the metal pattern 11, and at this time, as long as the amount of the light-shielding material is controlled, the dropped light shielding material 3, after being cured, can have the same thickness as the metal pattern 11.

Step S3: the light-shielding material 3 is cured to form a plurality of light-shielding patterns 31, so that the thickness of the light-shielding pattern 31 is the same as the thickness of the metal pattern 11, and removing the photoresist pattern 21, as shown in FIG. 2. In one embodiment of the present disclosure, the light-shielding material 3 is cured under light illumination to form a plurality of light-shielding patterns 31. Compared with the prior art, a mask for manufacturing the light-shielding pattern 31 can be omitted, so that the cost can be reduced.

In one embodiment of the present disclosure, after the photoresist pattern 21 is removed, an alignment layer 4 is formed, as shown in FIG. 2. In one embodiment of the present disclosure, the alignment layer 4 is formed by coating a PI (polyimide) liquid on the light-shielding pattern 31 and the metal pattern 11.

In one embodiment of the present disclosure, since the light-shielding material 3 and the photoresist pattern 21 are opposite in hydrophobicity-hydrophilicity, with the repulsive force between the light-shielding material 3 and the photoresist pattern 21, when the light-shielding material 3 is dropping, the light-shielding material 3 can be completely filled between the adjacent metal patterns 11, at this time, as long as the amount of the light-shielding material 3 is controlled, the dropped light-shielding material 3, after being cured, can have the same thickness as the metal pattern 11. Therefore, the formed alignment layer 4 has a flat surface, a uniform thickness, uniform alignment properties, and a good orientation effect, thereby obtaining an array substrate with high performance. At the same time, in the present embodiment, only the photoresist pattern 21 having hydrophobicity-hydrophilicity opposite to that of the light-shielding material 3 is selected, and no additional process step is added, so the production cost of the array substrate in this embodiment is low.

In one embodiment of the present disclosure, the PI liquid is uniformly coated, and a PI layer having uniform alignment properties can be formed by rubbing or OA (Optical Alignment), thereby giving the liquid crystal a better orientation.

In one embodiment of the present disclosure, the substrate 10 may be a glass substrate. In other embodiments of the disclosure, the substrate 10 may be a substrate made of any other suitable material.

In an embodiment of the present disclosure, a method for manufacturing an array substrate is provided, the photoresist material used in the array substrate has mutually interchangeable hydrophobicity-hydrophilicity under light illumination. That is, when the photoresist material is hydrophilic, it becomes hydrophobic after being illuminated by light; or, when the photoresist material is hydrophobic, it becomes hydrophilic after being illuminated by light. In one embodiment of the present disclosure, a photoresist material with the following characteristics is used: having hydrophilicity when not exposed to light, that is, oleophobic; the photoresist material subjected to light illumination becomes hydrophobic, that is, lipophilic. In one embodiment of the present disclosure, the manufacturing method in the present embodiment will be described using a black matrix material (BM ink) as the light-shielding material 3. In one embodiment of the present disclosure, the black matrix material includes a carbon black material having a hydrophobic group connected to a molecular main chain (hereinafter referred to as a carbon black material). The hydrophobic group includes: a hydrocarbon group or an ester group. In other embodiments of the present disclosure, the light-shielding material 3 is not limited to the black matrix material, and may be any other suitable insulating material having light-shielding properties.

Figure 3:
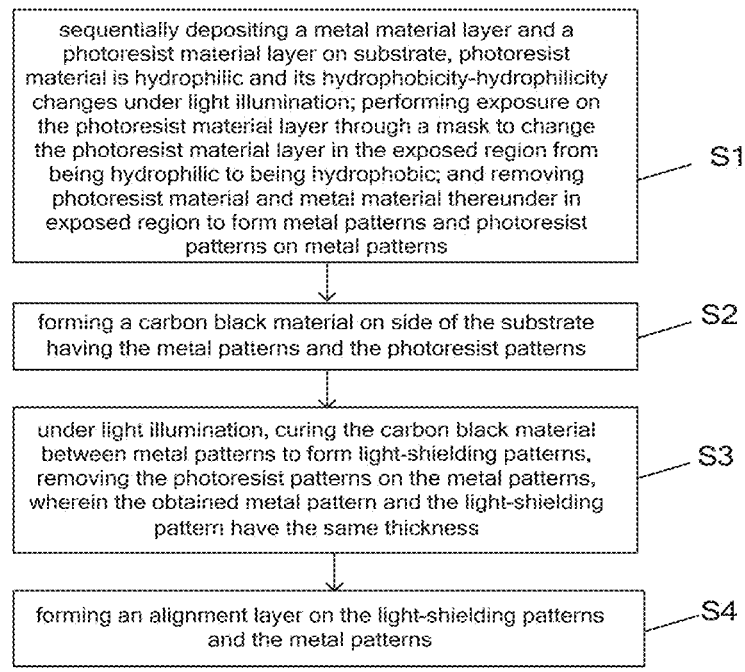
FIG. 3 is a flow chart of a method for manufacturing an array substrate according to some embodiments of the present disclosure.
Figure 4:
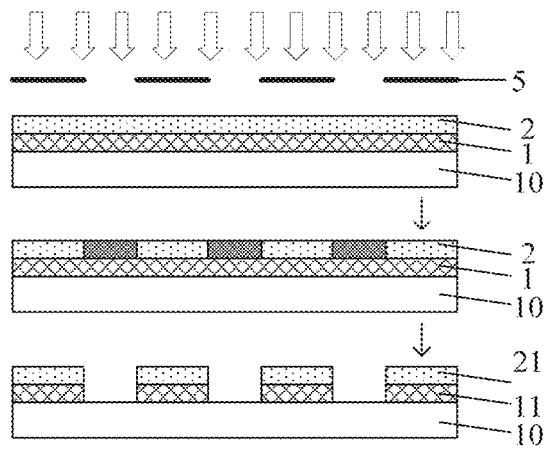
FIG. 4 is a process flow diagram of a method for manufacturing an array substrate according to some embodiments of the present disclosure.
Figure 4:
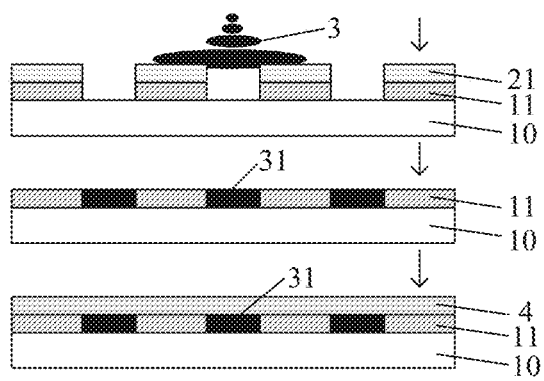

FIG. 3 is a flow chart of a method for manufacturing an array substrate according to some embodiments of the present disclosure; FIG. 4 is a process flow diagram of a method for manufacturing an array substrate according to some embodiments of the present disclosure.

As shown in FIG. 3 and FIG. 4, the method for manufacturing the array substrate in this embodiment is specifically described below. The method for manufacturing the array substrate includes the following steps S31 to S34, as shown in FIG. 3:

Step S31: as shown in FIG. 4, a metal material layer 1 and a photoresist material layer 2 are sequentially deposited on the substrate 10, the photoresist material is hydrophilic and its hydrophobicity-hydrophilicity changes under light illumination; the photoresist material layer 2 is exposed to light (for example, UV light) through a mask 5 (e.g., a metal pattern mask) to change the property of the photoresist material in the exposed region from being hydrophilic to being hydrophobic, and then (e.g., with developer) removing the photoresist material in the exposed region, and the metal material in the exposed region to form a plurality of metal patterns 11 and a plurality of photoresist patterns 21 on the plurality of metal patterns 11 by a patterning process. At this time, the property of the plurality of photoresist patterns 21 is still hydrophilic because they are not exposed to light. In one embodiment of the present disclosure, the thickness of the metal pattern 11 is typically around 2 um.

Step S32: as shown in FIG. 4, a BM ink is formed (e.g., dripped) on one side of the substrate 10 having the metal patterns 11 and the photoresist patterns 21. Since the photoresist pattern 21 on the metal pattern 11 has hydrophilic property, and the BM ink has hydrophobic property, the two have repulsive force therebetween, the carbon black material all fills into the gap between the metal patterns 11 without the photoresist pattern 21, there is no residual carbon black material above the photoresist pattern 21; at this time, as long as the amount of the carbon black material is controlled, the filled carbon black material, after being cured, has the same thickness as the metal pattern 11.

Step S33: as shown in FIG. 4, subjected to light illumination, the carbon black material between the metal patterns 11 is cured to form a plurality of light-shielding patterns 31, that is, a plurality of black matrix (BM) patterns 31 are formed; thereafter, the photoresist patterns 21 on the metal patterns 11 are removed, and the obtained metal pattern 11 and the light-shielding pattern 31 have the same thickness. Compared with the prior art, a mask for forming the light-shielding pattern 31 can be omitted, so that the cost can be reduced.

Since the carbon black material still has fluidity when it is not cured, a thickness of the light-shielding pattern 31 can be ensured to be the same as the thickness of the adjacent metal patterns 11 after being cured, thereby preventing the thickness of the light-shielding pattern 31 from being different from the thickness of the adjacent metal patterns 11 and thus avoiding unevenness problems.

In one embodiment of the present disclosure, when the carbon black material is cured under light illumination, light may be directly illuminated onto the surface of the photoresist pattern 21 and the carbon black material, and this illumination does not change hydrophilicity of the photoresist material.

In one embodiment of the present disclosure, the photoresist pattern 21 may be blocked by a mask when the carbon black material is cured, and thus only the carbon black material is cured to form the light-shielding pattern 31.

Step S34: an alignment layer 4 is formed on the light-shielding patterns 31 and the metal patterns 11, as shown in FIG. 4. At this time, the surface of the alignment layer is flat and has a good orientation effect, thereby obtaining an array substrate with good performance.

In one embodiment of the present disclosure, the PI (polyimide) liquid is uniformly coated, and a PI layer having uniform alignment properties may be formed by rubbing or OA (Optical Alignment), thereby making the liquid crystals have more desirable orientation. In one embodiment of the present disclosure, the substrate 10 may be a glass substrate. In other embodiments of the disclosure, the substrate 10 may be a substrate made of any other suitable material.

Figure 5:
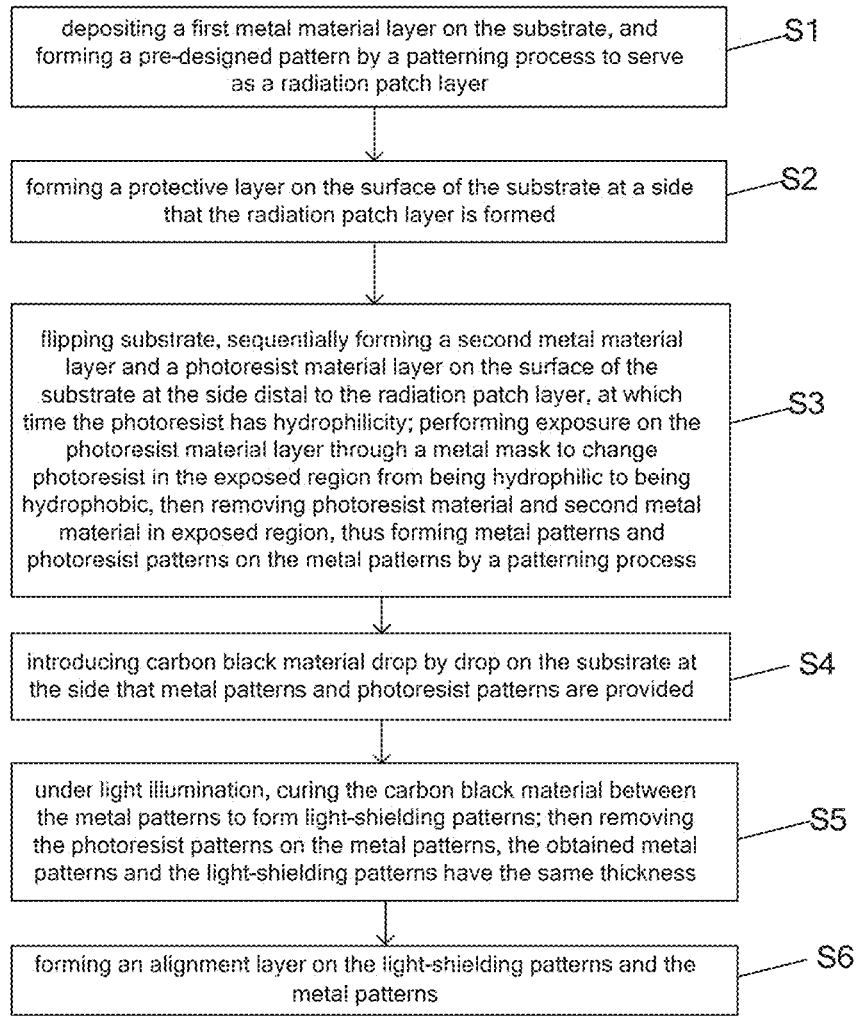
FIG. 5 is a flow chart of a method for manufacturing a liquid crystal antenna substrate according to some embodiments of the present disclosure.

FIG. 5 is a flow chart of a method for manufacturing a liquid crystal antenna substrate according to some embodiments of the present disclosure. The embodiment provides a method for manufacturing a liquid crystal antenna substrate. The liquid crystal antenna substrate manufactured by the method is used as an upper substrate of a liquid crystal antenna, and the metal pattern 11 on the substrate 10 functions as a ground electrode. The photoresist material and the light-shielding material 3 used in the present embodiment are the same as those in the embodiment described with reference to FIGS. 1 to 4, and the used processes are also substantially the same as those in the embodiment described with reference to FIGS. 1 to 4. In the following embodiment, the photoresist and the light-shielding material 3 used are the same as those in the embodiment described with reference to FIGS. 3 to 4.

As shown in FIG. 5, the method for manufacturing the liquid crystal antenna substrate in the present embodiment will be described below. The method for manufacturing the liquid crystal antenna substrate includes the following steps S51 to S56:

Step S51: a first metal material layer 1 is deposited on the substrate 10, and a pre-designed pattern is formed by a patterning process to serve as a radiation patch layer.

Step S52: an insulating layer is formed on the entire surface of the substrate 10 at the side that the radiation patch layer is formed, to function as a protective layer of the radiation patch layer.

Step S53: the substrate 10 is flipped, a second metal material layer 1 and a photoresist material layer 2 are sequentially formed on the surface of the substrate 10 at the side distal to the radiation patch layer, at which time the photoresist has hydrophilicity; the photoresist material layer is exposed (e.g., by UV illumination) through a metal mask to change the photoresist in the exposed region from being hydrophilic to being hydrophobic, then the photoresist and a second metal material in the exposed region is removed, thus forming a plurality of metal patterns (i.e., ground electrodes) and a plurality of photoresist patterns 21 on the plurality of metal patterns by a patterning process, At this time, the photoresist pattern 21 is still hydrophilic since it is not exposed. In one embodiment of the present disclosure, the thickness of the metal pattern is typically around 2 um.

Step S54: BM ink is introduced drop by drop on the substrate 10 at the side that the metal pattern and the photoresist pattern 21 are provided. Since the photoresist pattern 21 on the metal pattern is hydrophilic, the carbon black material is hydrophobic, and the photoresist pattern 21 and the carbon black material have repulsive force therebetween. Therefore, the carbon black material all fills into the gap between the metal patterns 11 without the photoresist pattern 21, and there is no residual carbon black material on the photoresist pattern 21; at this time, as long as the amount of the carbon black material is controlled, the filled carbon black material, after being cured, has the same thickness as the metal pattern.

Step S55: under light illumination, the carbon black material between the metal patterns is cured to form a plurality of light-shielding patterns 31, that is, a plurality of black matrix (BM) patterns are formed; then, the photoresist patterns 21 on the metal patterns 11 are removed, the obtained metal pattern and the light-shielding pattern 31 have the same thickness. Compared with the prior art, a mask for forming the light-shielding pattern 31 can be omitted, so that the cost can be reduced.

Since the carbon black material still has fluidity when it is not cured, a thickness of the light-shielding pattern 31 may be ensured to be the same as the thickness of the adjacent metal patterns 11 after the carbon black material is cured, thereby preventing the thickness of the light-shielding pattern 31 from being different from the thickness of the adjacent metal patterns 11, and thud avoid unevenness problems.

In one embodiment of the present disclosure, when the carbon black material is cured under light illumination, light may be directly illuminated onto the surface of the photoresist pattern 21 and the carbon black material, and this light illumination does not change hydrophobicity-hydrophilicity of the photoresist material.

In one embodiment of the present disclosure, the photoresist pattern 21 may be blocked by a mask when the carbon black material is cured, and only the carbon black material is cured to form the light-shielding pattern 31.

Step S56: an alignment layer 4 is formed on the light-shielding pattern 31 and the metal pattern 11, and at this time, the surface of the alignment layer is flat and has a good orientation effect, thereby obtaining a liquid crystal antenna substrate with good performance.

In the embodiment of the present disclosure, a method for manufacturing a liquid crystal antenna substrate is also provided. The liquid crystal antenna substrate manufactured by the method is used as a lower substrate of a liquid crystal antenna, and the metal pattern 11 on the substrate 10 is a microstrip line. The photoresist material and the light-shielding material 3 used in the present embodiment are the same as those in the embodiment described with reference to FIGS. 1 to 4, and the processes are also substantially the same those in the embodiment described with reference to FIGS. 1 to 4, and thus will not be described in detail herein.

In an embodiment of the disclosure, a method for manufacturing a liquid crystal antenna is also provided. In one embodiment of the present disclosure, the method may be used to manufacture a liquid crystal antenna, and may alternatively be used to manufacture a liquid crystal display device, a liquid crystal phase shifter, and the like. In the present embodiment, a liquid crystal antenna is taken as an example. The method for manufacturing the liquid crystal antenna includes the steps of manufacturing the upper substrate and/or the lower substrate by the method in the embodiment described with reference to FIGS. 1 to 4. In one embodiment, the upper substrate and/or the lower substrate are manufactured by the method described above, and then the upper substrate and the lower substrate are assembled to form a cell with the side of the upper substrate with the ground electrode facing towards the side of the lower substrate with the microstrip line, and liquid crystals are filled into the cell using a ODF (One Drop Filling) or irrigation crystal method, and the periphery of cell is sealed with sealant to form the liquid crystal antenna.

Figure 6:
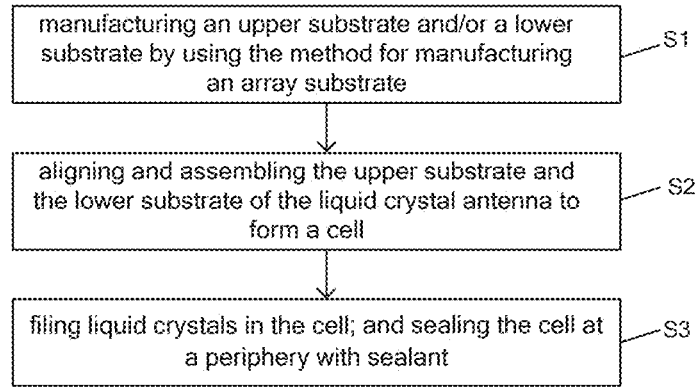
FIG. 6 is a flow chart of a method for manufacturing a liquid crystal antenna according to some embodiments of the present disclosure.

FIG. 6 is a flow chart of a method for manufacturing a liquid crystal antenna according to some embodiments of the present disclosure. In an embodiment of the disclosure, the method for manufacturing the liquid crystal antenna includes the following steps S61-S63:

Step S61: an upper substrate and/or a lower substrate are manufactured by using the method in the embodiment described with reference to FIG. 1 to FIG. 4 such that a plurality of metal patterns in the lower substrate function as microstrip lines; and/or a plurality of metal patterns in the upper substrate function as ground electrodes.

In one embodiment, in the process of manufacturing the upper substrate by the method in the embodiment described with reference to FIGS. 1 to 4, the method further includes forming a pattern of the antenna radiation patch layer by a patterning process, and forming a protective layer on a side of the substrate on which the antenna radiation patch layer is formed.

Step S62: the upper substrate and the lower substrate of the liquid crystal antenna are disposed opposite to each other and assembled to form a cell. In one embodiment, the side of the upper substrate having ground electrodes faces towards the side of the lower substrate having microstrip lines.

Step S63: the liquid crystals are filled in the cell; and the periphery of cell is sealed with sealant. In one embodiment, the liquid crystals are filled in the cell using the ODF or irrigation crystal method, and the periphery of cell is sealed with sealant to form the liquid crystal antenna.

Figure 7:
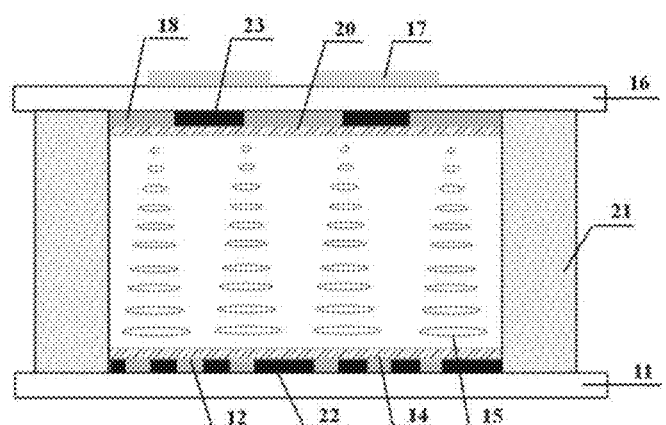
FIG. 7 is a cross-sectional view of a structure of a liquid crystal antenna with a black matrix pattern according to some embodiments of the present disclosure.

FIG. 7 is a cross-sectional view of a structure of a liquid crystal antenna with a black matrix pattern according to some embodiments of the present disclosure. In FIG. 7, the liquid crystal antenna includes an upper substrate and a lower substrate, the upper substrate includes: a substrate 16, an antenna radiation patch layer 17, a plurality of ground electrodes 18, a plurality of black matrix patterns 23, an alignment layer 20 and a protective layer (not shown); and the lower substrate includes: a substrate 11, a plurality of microstrip lines 12, a plurality of black matrix patterns 22, and an alignment layer 14. Liquid crystal molecules 15 are filled between the upper substrate and the lower substrate. And a cell is formed after the upper substrate and the lower substrate are disposed opposite to each other and assembled, and the sealant 21 is used to seal the periphery of the cell. In FIG. 7, both the upper substrate and the lower substrate are manufactured by the method in the embodiment described with reference to FIGS. 1 to 4.

The upper substrate and the lower substrate of the liquid crystal antenna of the embodiment of the present disclosure are both substrates with a black matrix manufactured by using a photoresist material, hydrophilicity and hydrophobicity of which are changeable under light illumination, since the thickness of the black matrix pattern is the same as the thickness of the metal pattern, the resultant alignment layer is uniform, so that orientation of the liquid crystal molecules in the vicinity of the alignment layer are more desirable, as shown in FIG. 7, thereby obtaining a liquid crystal antenna with good performance. At the same time, since the mask is not required when forming the black matrix pattern, the cost reduction effect is achieved.

It is to be understood that, the above embodiments are merely exemplary embodiments employed to explain the principles of the disclosure, but the disclosure is not limited thereto. Various modifications and improvements could be made by a person skilled in the art without departing from the spirit and scope of the disclosure. These modifications and improvements are also considered to be within the scope of the disclosure.

What is claimed is:

1. A method for manufacturing an array substrate, comprising:
   sequentially depositing a metal material layer and a photoresist material layer on a substrate, and forming a plurality of metal patterns and a plurality of photoresist patterns on the plurality of metal patterns by a patterning process;
   forming a light-shielding material between at least two adjacent metal patterns; wherein the light-shielding material and the plurality of photoresist patterns have opposite hydrophobicity-hydrophilicity; and
   curing the light-shielding material to form at least one light-shielding pattern such that a thickness of the at least one light-shielding pattern is the same as a thickness of the plurality of metal patterns, and removing the plurality of photoresist patterns.

2. The method according to claim 1, wherein the curing the light-shielding material comprises:
   curing the light-shielding material under light illumination.

3. The method according to claim 1, wherein the photoresist material layer comprises a material that is hydrophilic when not exposed to light and becomes hydrophobic after exposed to light.

4. The method according to claim 3, wherein the sequentially depositing a metal material layer and a photoresist material layer on the substrate, and forming a plurality of metal patterns and a plurality of photoresist patterns on the plurality of metal patterns by a patterning process comprises:
   sequentially depositing the metal material layer and a positive photoresist material layer on the substrate;
   providing a mask over the photoresist material layer for exposure;
   removing an exposed part of the photoresist material layer and leaving an unexposed part of the photoresist material layer to form the plurality of photoresist patterns; and
   removing a part of the metal material layer under the exposed part of the photoresist material layer to form the plurality of metal patterns.

5. The method according to claim 4, wherein the light-shielding material comprises a carbon black material having a hydrophobic group connected to a molecular main chain.

6. The method according to claim 5, wherein the hydrophobic group comprises a hydrocarbon group or an ester group.

7. The method according to claim 5, wherein the carbon black material is cured under light illumination.

8. The method according to claim 3, wherein the sequentially depositing a metal material layer and a photoresist material layer on the substrate, and forming a plurality of metal patterns and a plurality of photoresist patterns on the plurality of metal patterns by a patterning process comprises:
   sequentially depositing the metal material layer and a negative photoresist material layer on the substrate;
   providing a mask over the photoresist material layer for exposure;
   removing an unexposed part of the photoresist material layer and leaving an exposed part of the photoresist material layer to form the plurality of photoresist patterns; and removing a part of the metal material layer under the unexposed part of the photoresist material layer to form the plurality of metal patterns.

9. The method according to claim 1, wherein after removing the plurality of photoresist patterns, the method further comprises:
forming an alignment layer on the at least one light-shielding pattern and the plurality of metal patterns.

10. A method for manufacturing a liquid crystal antenna, comprising:
manufacturing at least one substrate of an upper substrate and a lower substrate of the liquid crystal antenna by the method according to claim 1.

11. The method according to claim 10, wherein the at least one substrate comprises a lower substrate, and the plurality of metal patterns are microstrip lines.

12. The method according to claim 10, wherein the at least one substrate comprises an upper substrate, and the plurality of metal patterns are ground electrodes.

13. The method according to claim 12, wherein before sequentially depositing the metal material layer and the photoresist material layer on the substrate, the method further comprises:
depositing a metal material on a side of the substrate distal to the plurality of metal patterns, and forming a pattern of an antenna radiation patch layer by a patterning process; and
forming a protective layer on a side of the substrate on which the antenna radiation patch layer is formed.

14. The method according to claim 13, further comprising manufacturing the lower substrate;
wherein the manufacturing the lower substrate comprises:
sequentially depositing a metal material layer and a photoresist material layer on a substrate, and forming a plurality of metal patterns and a plurality of photoresist patterns on the plurality of metal patterns by a patterning process;
forming a light-shielding material between at least two adjacent metal patterns; wherein the light-shielding material and the plurality of photoresist patterns have opposite hydrophobicity-hydrophilicity; and
curing the light-shielding material to form at least one light-shielding pattern such that a thickness of the at least one light-shielding pattern is the same as a thickness of the plurality of metal patterns, and removing the plurality of photoresist patterns.

15. The method according to claim 14, further comprising:
aligning and assembling the upper substrate and the lower substrate to form a cell;
filling liquid crystals in the cell; and
sealing the cell at a periphery with sealant.

16. The method according to claim 15, wherein the filling liquid crystals in the cell comprises filling liquid crystals in the cell using a one drop filling method or an irrigation crystal method.

17. The method according to claim 15, wherein the aligning and assembling the upper substrate and the lower substrate to form a cell comprises:
aligning and assembling the upper substrate and the lower substrate with a side of the upper substrate with ground electrodes facing towards a side of the lower substrate with microstrip lines.

18. The method according to claim 6, wherein the carbon black material is cured under light illumination.

19. The method according to claim 10, wherein the photoresist material layer comprises a material that is hydrophilic when not exposed to light and becomes hydrophobic after exposed to light; and
the sequentially depositing a metal material layer and a photoresist material layer on the substrate, and forming a plurality of metal patterns and a plurality of photoresist patterns on the plurality of metal patterns by a patterning process comprises:
sequentially depositing the metal material layer and a positive photoresist material layer on the substrate;
providing a mask over the photoresist material layer for exposure;
removing an exposed part of the photoresist material layer and leaving an unexposed part of the photoresist material layer to form the plurality of photoresist patterns; and
removing a part of the metal material layer under the exposed part of the photoresist material layer to form the plurality of metal patterns.

20. The method according to claim 10, wherein the photoresist material layer comprises a material that is hydrophilic when not exposed to light and becomes hydrophobic after exposed to light; and
wherein the sequentially depositing a metal material layer and a photoresist material layer on the substrate, and forming a plurality of metal patterns and a plurality of photoresist patterns on the plurality of metal patterns by a patterning process comprises:
sequentially depositing the metal material layer and a negative photoresist material layer on the substrate;
providing a mask over the photoresist material layer for exposure;
removing an unexposed part of the photoresist material layer and leaving an exposed part of the photoresist material layer to form the plurality of photoresist patterns; and
removing a part of the metal material layer under the unexposed part of the photoresist material layer to form the plurality of metal patterns.

* * * * *